United States Patent
Iwashita et al.

(10) Patent No.: US 12,114,736 B2
(45) Date of Patent: Oct. 15, 2024

(54) SHOE MANUFACTURING SYSTEM AND METHOD OF CONTROLLING SHOE MANUFACTURING SYSTEM

(71) Applicant: ASICS CORPORATION, Kobe (JP)

(72) Inventors: Naoto Iwashita, Kobe (JP); Takashi Yamade, Kobe (JP); Shinsaku Wakasugi, Kobe (JP)

(73) Assignee: ASICS Corporation, Hyogo (JP)

( * ) Notice: Subject to any disclaimer, the term of this patent is extended or adjusted under 35 U.S.C. 154(b) by 865 days.

(21) Appl. No.: 16/972,515

(22) PCT Filed: Nov. 26, 2019

(86) PCT No.: PCT/JP2019/046086
§ 371 (c)(1),
(2) Date: Dec. 4, 2020

(87) PCT Pub. No.: WO2021/106059
PCT Pub. Date: Jun. 3, 2021

(65) Prior Publication Data
US 2021/0315324 A1    Oct. 14, 2021

(51) Int. Cl.
*A43D 119/00*     (2006.01)
*A43D 1/08*       (2006.01)
(Continued)

(52) U.S. Cl.
CPC ............ *A43D 119/00* (2013.01); *A43D 25/06* (2013.01); *A43D 25/18* (2013.01); *G06F 30/17* (2020.01);
(Continued)

(58) Field of Classification Search
CPC ...... A43D 119/00; A43D 25/06; A43D 25/18; A43D 2200/10; A43D 2200/60;
(Continued)

(56) References Cited

U.S. PATENT DOCUMENTS

| 4,996,012 A      | 2/1991 | Gierschewski et al. |
| 2013/0132038 A1* | 5/2013 | Regan ............... G06F 30/00 703/1 |

(Continued)

FOREIGN PATENT DOCUMENTS

| CN | 108135331 A | 6/2018 |
| DE | 4100806 A1  | 2/1992 |

(Continued)

OTHER PUBLICATIONS

First Office Action issued in corresponding CN Application No. 201980036787.8, dated Nov. 24, 2021, w/ Machine English Translation.

(Continued)

*Primary Examiner* — Manish S Shah
*Assistant Examiner* — Christian T Bryant
(74) *Attorney, Agent, or Firm* — Rimon P.C.

(57) ABSTRACT

A shoe manufacturing system (100) processes a to-be-bonded surface (11a) of an upper (11) before bonding a sole to the upper (11). The shoe manufacturing system (100) includes a holding platform (10), a camera (20a, 20b), an applicator (30), a robot arm (40), and a control device (60). The control device (60) identifies a boundary of the to-be-bonded surface (11a) of the upper (11) that is to serve as a master model M among a plurality of uppers (11), for defining an area of the to-be-bonded surface (11a) to be processed, based on three-dimensional shape data of the master model M acquired by the camera (20a). The control device (60) controls the robot arm (40) for each of the uppers (11) (such as products P1 to P3) other than the master model M, to cause the applicator (30) to apply an adhesive to the area of the to-be-bonded surface (11a) enclosed by the identified boundary.

17 Claims, 11 Drawing Sheets

(51) Int. Cl.
　　　*A43D 25/06*　　　(2006.01)
　　　*A43D 25/18*　　　(2006.01)
　　　*G06F 30/17*　　　(2020.01)
　　　*A43D 1/02*　　　(2006.01)

(52) U.S. Cl.
　　　CPC ............... *A43D 1/025* (2013.01); *A43D 1/08* (2013.01); *A43D 25/183* (2013.01); *A43D 2200/10* (2013.01); *A43D 2200/40* (2013.01); *A43D 2200/60* (2013.01)

(58) Field of Classification Search
　　　CPC .. A43D 2200/40; A43D 1/025; A43D 25/183; A43D 1/08; G06F 30/17
　　　See application file for complete search history.

(56) References Cited

U.S. PATENT DOCUMENTS

| | | | |
|---|---|---|---|
| 2014/0081441 A1 | 3/2014 | Regan et al. | |
| 2015/0096426 A1* | 4/2015 | Culver | G10D 3/173 84/322 |
| 2015/0201709 A1 | 7/2015 | Jurkovic et al. | |
| 2019/0365054 A1 | 12/2019 | Chang et al. | |

FOREIGN PATENT DOCUMENTS

| | | |
|---|---|---|
| EP | 0510217 A1 | 10/1992 |
| EP | 0512773 A1 | 11/1992 |
| JP | H1-314502 A | 12/1989 |
| JP | H05-108131 A | 4/1993 |
| JP | H5-130905 A | 5/1993 |
| JP | 2000-190264 A | 7/2000 |
| WO | 2017/037932 A1 | 3/2017 |
| WO | 2020/183621 A1 | 9/2020 |

OTHER PUBLICATIONS

International Search Report issued in corresponding Inteernatonal Patent Application No. PCT/JP2019/046086, dated Feb. 18, 2020, with English translation.

Japanese Office Action issued in corresponding Japanese Patent Application No. 2020-564286, dated Apr. 20, 2020, with English translation.

Extended European Search Report issued in corresponding European Patent Application No. 19927576.9, dated May 13, 2022.

* cited by examiner

FIG.4
(a)
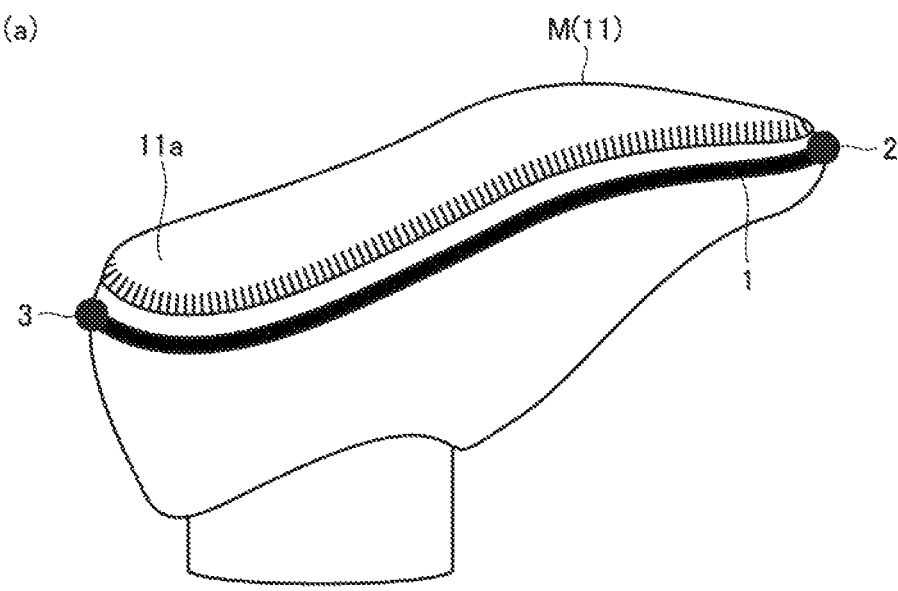
(b)
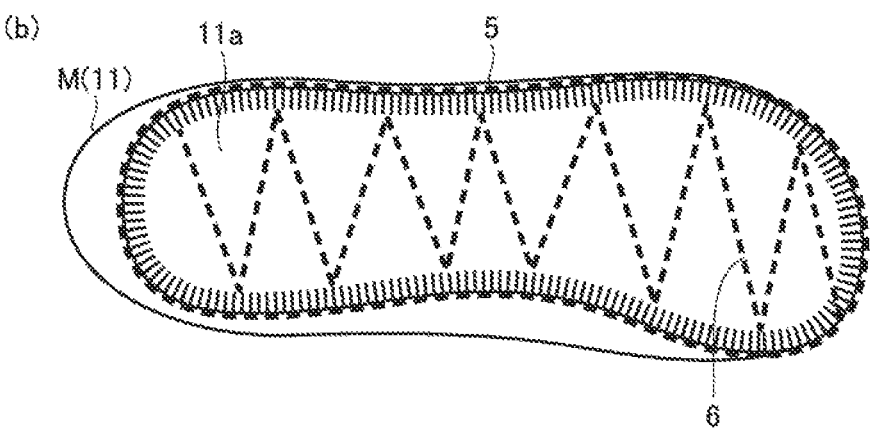

FIG.5

| SHOE TYPE | PART TYPE | SHOE SIZE | SHOE WIDTH | RIGHT/ LEFT | BOUNDARY INFORMATION | MOVEMENT PATH INFORMATION |
|---|---|---|---|---|---|---|
| SH1 | UPPER | 25.0cm | EE | RIGHT | AAA | aaa |
| SH2 | UPPER | 23.0cm | EEE | LEFT | ABC | bbb |
| SH3 | UPPER | 26.0cm | E | LEFT | BBA | ccc |
| SH4 | UPPER | 25.0cm | EE | RIGHT | CAA | ddd |
| | | | | | | |
| | | | | | | |
| | | | | | | |

FIG.7
(a)
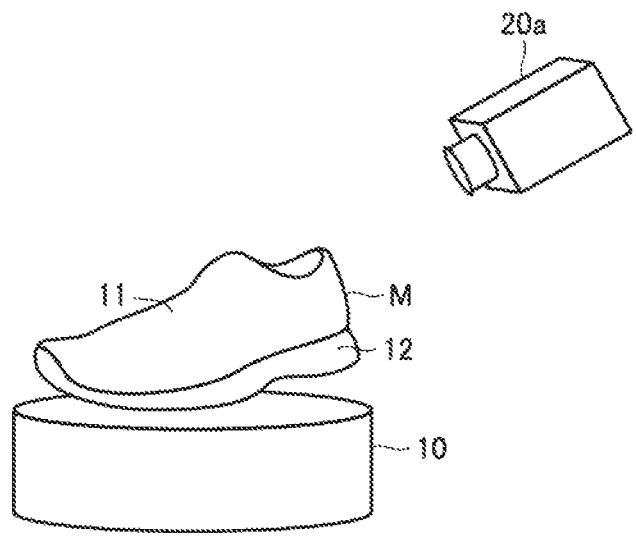
(b)
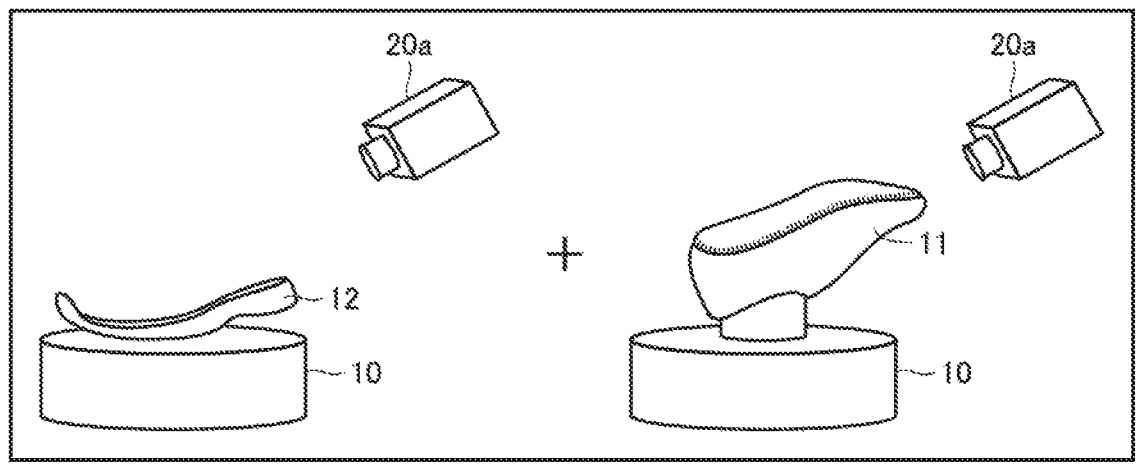

SHOE MANUFACTURING SYSTEM AND METHOD OF CONTROLLING SHOE MANUFACTURING SYSTEM

TECHNICAL FIELD

The present disclosure relates to a shoe manufacturing system and a method of controlling the shoe manufacturing system.

BACKGROUND ART

Manufacture of a shoe includes the step of bonding a first shoe part and a second shoe part together. Specifically, supposing that the first shoe part is an upper and the second shoe part is a sole, the manufacture includes the step of applying an adhesive to a to-be-bonded surface of the upper and bonding the upper and the sole together.

A system for automating this manufacture step is disclosed for example in PTL 1. PTL 1 discloses that a scribe line drawn on an upper is read with a camera, and a tool movement path is generated in an area enclosed by the read scribe line. PTL 1 further discloses that a spray nozzle which is one of tools is moved along the generated tool movement path to spray an adhesive to a to-be-bonded surface of the upper.

CITATION LIST

Patent Literature

PTL 1: US2014/0081441

SUMMARY OF INVENTION

Technical Problem

The system disclosed in PTL 1 is required to draw a scribe line on the upper for each product and read the scribe line with a camera, in order to generate a movement path for moving the spray nozzle to apply an adhesive. Thus, in the system disclosed in PTL 1, while the operation of applying an adhesive can be automated by means of a robot or the like, the operation of drawing the scribe line on the upper for each product cannot be automated, which limits reduction of the labor required for the manufacture steps.

In view of this, an object of the present disclosure is to provide a shoe manufacturing system that enables reduction of the labor for the manufacture step of processing a to-be-bonded surface of a first shoe part before bonding a second shoe part to the first shoe part, as well as a method of controlling the shoe manufacturing system.

Solution to Problem

According to an aspect of the present disclosure, a shoe manufacturing system for processing a to-be-bonded surface of a first shoe part before bonding a second shoe part to the first shoe part includes: a holder that holds the first shoe part; an imager that acquires three-dimensional shape data of the first shoe part held by the holder; a processing unit that processes the to-be-bonded surface; a moving mechanism that moves the processing unit; and a controller that controls the moving mechanism based on the three-dimensional shape data acquired by the imager, and controls the processing unit that processes the to-be-bonded surface. The controller identifies a boundary of the to-be-bonded surface of the first shoe part that is to serve as a master model among a plurality of the first shoe parts, for defining an area of the to-be-bonded surface to be processed, based on the three-dimensional shape data of the master model acquired by the imager, and the controller controls the moving mechanism for each of the first shoe parts other than the master model, to enable the processing unit to process the area of the to-be-bonded surface enclosed by the identified boundary.

According to an aspect of the present disclosure, another shoe manufacturing system for processing a to-be-bonded surface of a first shoe part before bonding a second shoe part to the first shoe part includes: a holder that holds the first shoe part; an imager that acquires three-dimensional shape data of the first shoe part held by the holder; a processing unit that processes the to-be-bonded surface; a moving mechanism that moves the processing unit; and a controller that controls the moving mechanism based on the three-dimensional shape data acquired by the imager, and controls the processing unit that processes the to-be-bonded surface. The controller identifies a boundary of the to-be-bonded surface for defining an area of the to-be-bonded surface to be processed, based on three-dimensional CAD data of the first shoe part to which the second shoe part is already bonded that is prepared in advance, and the controller controls the moving mechanism for each of the first shoe parts, to enable the processing unit to process the area of the to-be-bonded surface enclosed by the identified boundary.

According to an aspect of the present disclosure, a method of controlling a shoe manufacturing system for processing a to-be-bonded surface of a first shoe part before bonding a second shoe part to the first shoe part is provided, and the shoe manufacturing system includes: a holder that holds the first shoe part; an imager that acquires three-dimensional shape data of the first shoe part held by the holder; a processing unit that processes the to-be-bonded surface of the first shoe part to which the second shoe part is to be bonded; a moving mechanism that moves the processing unit; and a controller that controls the moving mechanism based on the three-dimensional shape data acquired by the imager, and controls the processing unit that processes the to-be-bonded surface. The method includes: identifying a boundary of the to-be-bonded surface of the first shoe part that is to serve as a master model among a plurality of the first shoe parts, for defining an area of the to-be-bonded surface to be processed, based on the three-dimensional shape data of the master model acquired by the imager; and controlling the moving mechanism for the first shoe parts other than the master model, to enable the processing unit to process the area of the to-be-bonded surface enclosed by the identified boundary.

According to an aspect of the present disclosure, another method of controlling a shoe manufacturing system for processing a to-be-bonded surface of a first shoe part before bonding a second shoe part to the first shoe part is provided, and the shoe manufacturing system includes: a holder that holds the first shoe part; an imager that acquires three-dimensional shape data of the first shoe part held by the holder; a processing unit that processes the to-be-bonded surface of the first shoe part to which the second shoe part is to be bonded; a moving mechanism that moves the processing unit; and a controller that controls the moving mechanism based on the three-dimensional shape data acquired by the imager, and controls the processing unit that processes the to-be-bonded surface. The method includes: identifying a boundary of the to-be-bonded surface for defining an area of the to-be-bonded surface to be processed, based on three-dimensional CAD data of the first shoe part to which the second shoe part is already bonded that is prepared in advance; and controlling the moving mechanism for each of the first shoe parts to enable the processing unit to process the area of the to-be-bonded surface enclosed by the identified boundary.

Advantageous Effects of Invention

According to an aspect of the present disclosure, the boundary of the to-be-bonded surface is identified for defining the area of the to-be-bonded surface to be processed, based on the three-dimensional shape data of the master model, and each of the first shoe parts is processed, which enables reduction of the labor required for identifying the boundary of each of the first shoe parts.

BRIEF DESCRIPTION OF DRAWINGS

FIG. 4 illustrates a scribe line and a movement path drawn on an upper.

FIG. 5 illustrates contents of information stored in a boundary database.

FIG. 7 illustrates a modification of a method of identifying a boundary based on three-dimensional shape data of a master model.

DESCRIPTION OF EMBODIMENTS

Figure 1:
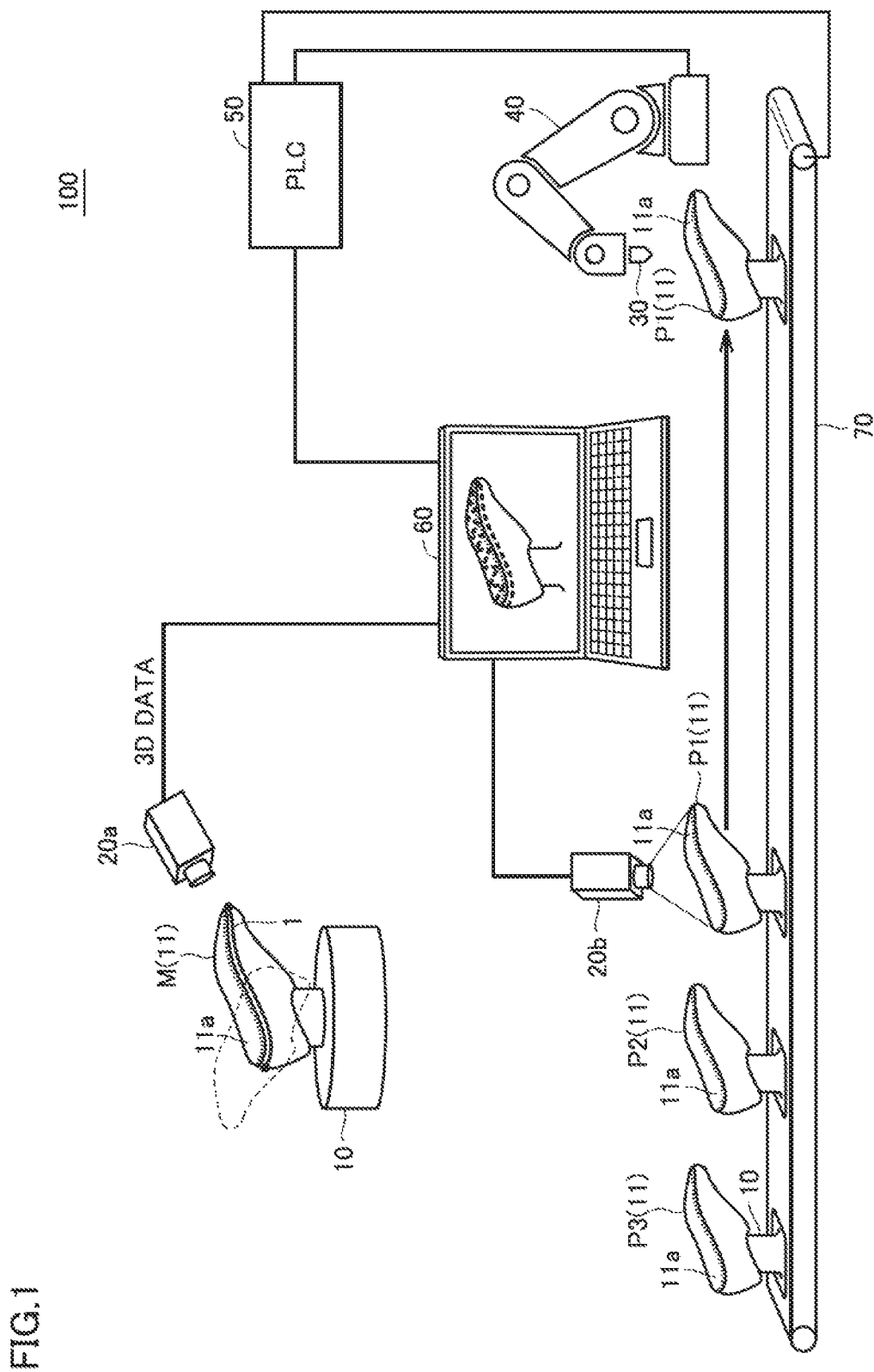
FIG. 1 is a schematic diagram showing an example configuration of a shoe manufacturing system according to Embodiment 1.

Embodiments of the present invention are described in detail with reference to the drawings. In the drawings, the same or corresponding parts are denoted by the same reference characters, and a description thereof is not repeated.

Embodiment 1

In connection with Embodiment 1, an example of the case to which the present invention is applied is described. First, in connection with a shoe manufacturing system according to Embodiment 1, a description is given of a configuration of a system for processing a to-be-bonded surface of a first shoe part before bonding a second shoe part to the first shoe part. It should be noted that while the first shoe part is described as an upper and the second shoe part is described as a sole in connection with the following embodiments, the parts are not limited to the upper or the sole as long as the parts are constituent parts of a shoe and are parts to be bonded together. For example, conversely the first shoe part may be a sole and the second shoe part may be an upper, or the first shoe part may be a midsole and the second shoe part may be an outsole, or the first shoe part may be a sole and the second shoe part may be a truss.

FIG. 1 is a schematic diagram showing an example configuration of a shoe manufacturing system 100 according to Embodiment 1. Referring to FIG. 1, shoe manufacturing system 100 includes a holding platform 10, cameras 20a, 20b, an applicator 30, a robot arm 40, and a control device 60. Shoe manufacturing system 100 further includes a PLC (programmable logic controller) 50 and a belt conveyor 70.

Holding platform 10 holds an upper 11 with a to-be-bonded surface 11a facing upward. Holding platform 10 includes a foot form called "last" made of resin or metal, for example, and a support that supports the foot form. The foot form has a side to be brought into contact with upper 11 and the opposite side in which a hole is formed for connecting to the support. A rod of the support is inserted in this hole so as to allow the support to support upper 11 with to-be-bonded surface 11a facing upward.

The foot form is inserted in upper 11 so as to allow holding platform 10 to hold upper 11. Thus, upper 11 can be held on holding platform 10 with to-be-bonded surface 11a of upper 11 facing upward and with to-be-bonded surface 11a of upper 11 substantially kept horizontal. Accordingly, processing such as application of an adhesive to to-be-bonded surface 11a of upper 11 is facilitated. In particular, when an adhesive is applied to to-be-bonded surface 11a of upper 11, the fact that upper 11 is held on holding platform 10 facilitates uniform application of the adhesive onto to-be-bonded surface 11a, and enables reduction or avoidance of unevenness of the adhesive.

Cameras 20a, 20b are capable of acquiring three-dimensional shape data of upper 11 held on holding platform 10. Camera 20a is a camera that acquires three-dimensional shape data of upper 11 of a master model M, and camera 20b is a camera that acquires three-dimensional shape data of upper 11 of a product P1, P2, P3 or the like, other than master model M. In connection with shoe manufacturing system 100, while camera 20a that acquires three-dimensional shape data from upper 11 of master model M and camera 20b that acquires three-dimensional shape data from upper 11 of product P1, P2, P3 or the like are described as separate cameras, these cameras may be a single camera.

Cameras 20a, 20b configured to acquire three-dimensional shape data acquire three-dimensional shape data of upper 11 using the technique of the focusing method. The method of acquiring three-dimensional shape data by cameras 20a, 20b is not limited to the focusing method, and any of the techniques such as confocal method, triangulation, white light interferometry, stereo method, photogrammetry, SLAM (Simultaneous Localization and Mapping), and optical coherence tomography (OCT) may be used to acquire the three-dimensional shape data. Cameras 20a, 20b configured based on any principle can be applied, as long as the cameras are configured to acquire the three-dimensional shape data using an optical scheme.

Applicator 30 applies an adhesive. Applicator 30 has a head in which an ejection port for an adhesive is formed, and is configured to be capable of ejecting an adhesive from the ejection port under control of PLC 50. In the present embodiment, for the sake of describing processing which is application of an adhesive to to-be-bonded surface 11a of upper 11, applicator 30 is provided. Processing, however, is not limited to this, and may alternatively be pretreatment or polishing, for example, as long as the processing is applied to to-be-bonded surface 11a of upper 11. Shoe manufacturing system 100 in which pretreatment is performed on to-be-bonded surface 11a of upper 11 includes an applicator for a pretreatment material instead of applicator 30, and shoe manufacturing system 100 in which polishing is performed on to-be-bonded surface 11a of upper 11 includes a polishing device instead of applicator 30.

Applicator 30 is coupled to the head of an arm of robot arm 40. Robot arm 40 includes a servo motor for moving and/or rotating applicator 30, for example, and is controlled by PLC 50. FIG. 1 shows an example of the configuration of robot arm 40, which is the so-called multi-joint (multi-axis) robot arm.

Figure 2:
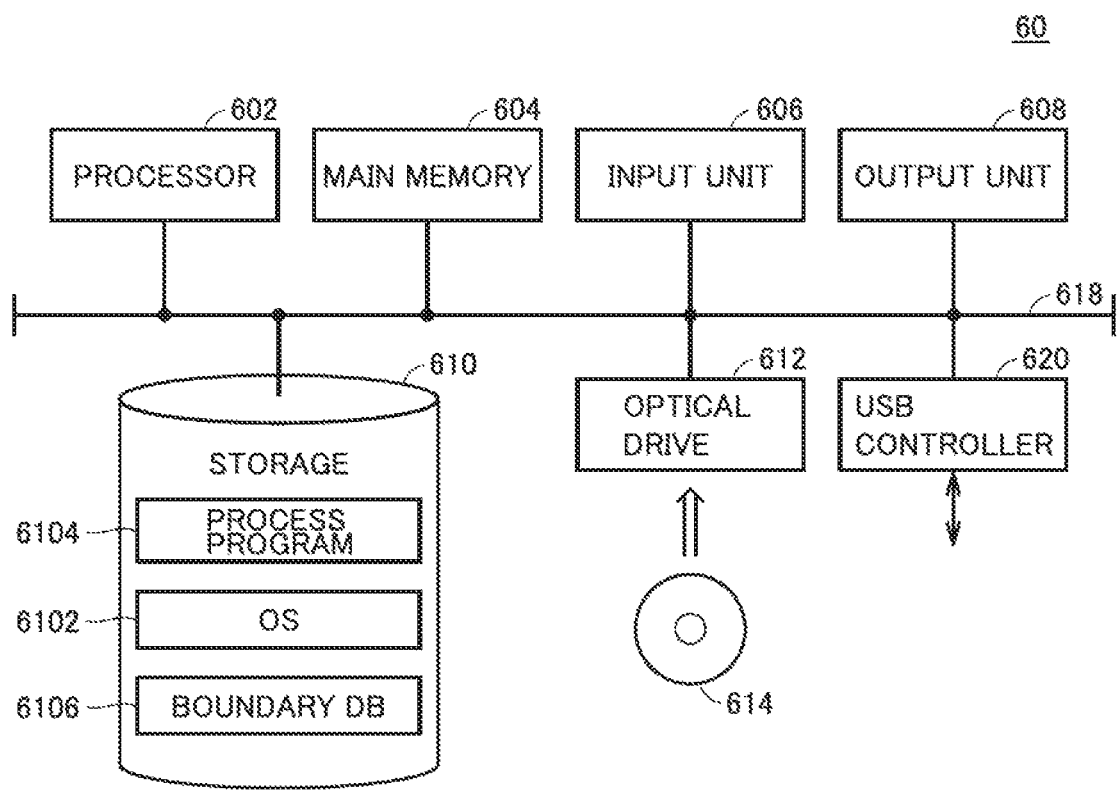
FIG. 2 is a schematic diagram showing an example hardware configuration of a control device of the shoe manufacturing system according to Embodiment 1.

Control device 60 controls robot arm 40 based on the three-dimensional shape data acquired by cameras 20a, 20b, and controls applicator 30 that processes to-be-bonded surface 11a. FIG. 2 is a schematic diagram showing an example hardware configuration of control device 60 of the shoe manufacturing system according to Embodiment 1. Referring to FIG. 2, control device 60 includes a processor 602, a main memory 604, an input unit 606, an output unit 608, a storage 610, an optical drive 612, and a USB controller 620. These components are connected through a processor bus 618.

Processor 602 is configured as a CPU, GPU or the like to read a program (an OS 6102 and a process program 6104 by way of example), deploy the program in main memory 604, and execute the program so as to implement processing such as bonding which is intended to be performed in shoe manufacturing system 100.

Main memory 604 is configured as a volatile memory such as DRAM or SRAM, for example. Storage 610 is configured as a nonvolatile memory such as HDD or SSD, for example.

Storage 610 stores, in addition to OS 6102 for implementing basic functions, process program 6104 for providing specific functions of control device 60. Specifically, process program 6104 is executed by processor 602 of control device 60 to implement processes to be performed in shoe manufacturing system 100. Further, storage 610 stores a boundary database 6106 including data regarding a boundary as described later herein.

Input unit 606 is configured as a keyboard and/or a mouse, for example, to receive a user's operation. Output unit 608 is configured as a display, various indicators, and/or a printer, for example, to output results of processes, for example, from processor 602.

USB controller 620 exchanges data with another control device, for example, through USB connection.

Control device 60 includes optical drive 612 that reads, from a recording medium 614 (an optical recording medium such as DVD (Digital Versatile Disc, for example) storing a computer-readable program in a non-transitory manner, and installs the read program in storage 610, for example.

Process program 6104 for example to be executed in control device 60 may be installed through computer-readable recording medium 614, or may be installed by being downloaded from a server device on a network, for example. Functions provided by a support device 600 according to the present embodiment may also be implemented by means of a part of a module(s) provided by the OS.

While FIG. 2 shows an example configuration where processor 602 executes a program to provide specific required functions of control device 60, some or all of these functions to be provided may be implemented by a dedicated hardware circuit (such as ASIC or FPGA, for example). The configuration of control device 60 shown in FIG. 2 is given by way of example, and control device 60 is not limited to this configuration and may not include USB controller 620 or the like, for example.

PLC 50 controls respective operations of applicator 30, robot arm 40, and belt conveyor 70, based on a control signal from control device 60. In the present embodiment, PLC 50 is provided separately from control device 60, and PLC 50 controls applicator 30, robot arm 40, and belt conveyor 70. Alternatively, control device 60 may directly control respective operations of robot arm 40 and belt conveyor 70. PLC 50, together with control device 60, implements functions as a controller of shoe manufacturing system 100.

Figure 3:
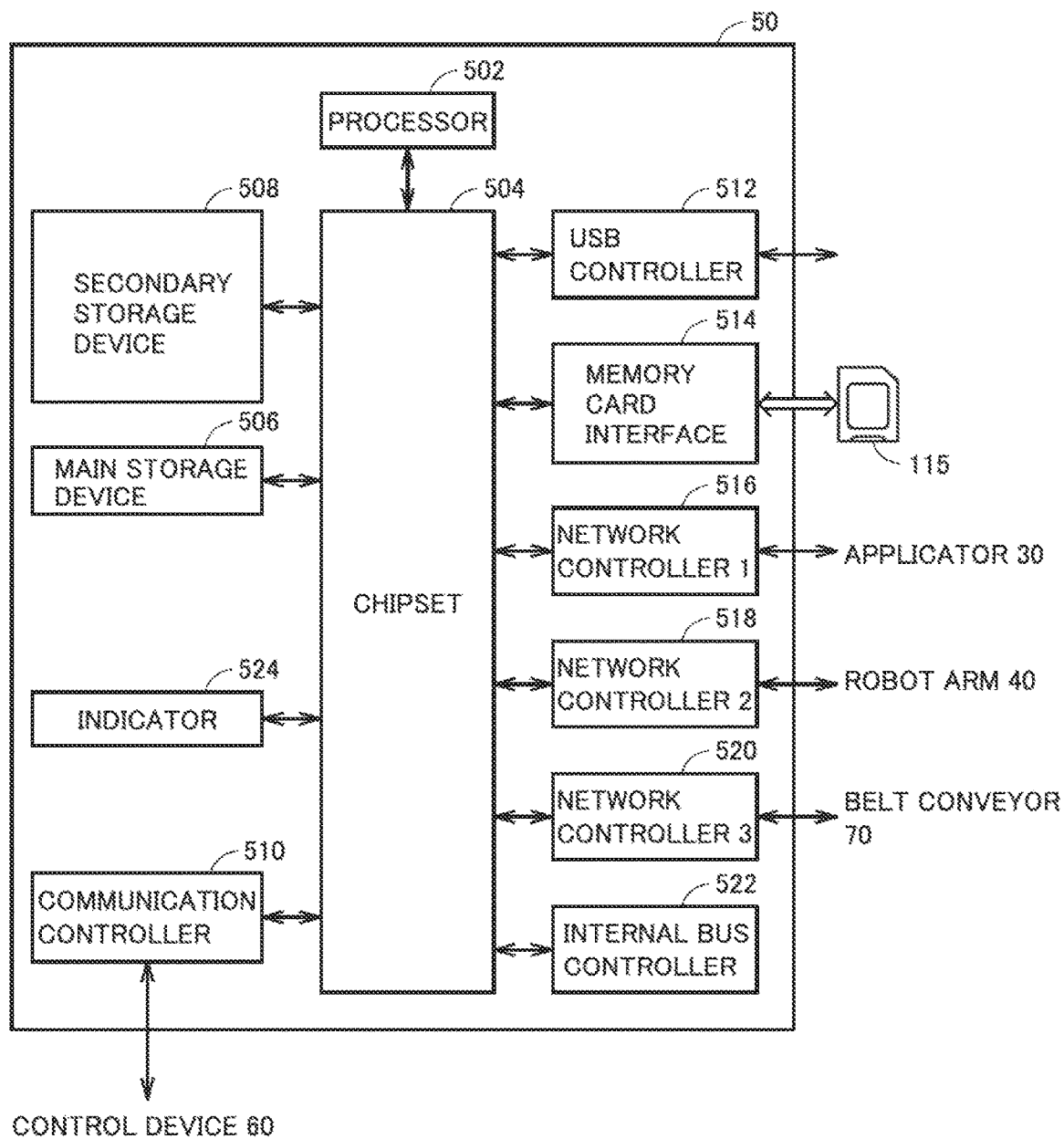
FIG. 3 is a schematic diagram showing an example hardware configuration of a PLC of the shoe manufacturing system according to Embodiment 1.

FIG. 3 is a schematic diagram showing an example hardware configuration of PLC 50 of the shoe manufacturing system according to Embodiment 1. Referring to FIG. 3, PLC 50 includes, as main components, a processor 502 such as CPU (Central Processing Unit) or GPU (Graphical Processing Unit), a chipset 504, a main storage device 506, a secondary storage device 508, a communication controller 510, a USB (Universal Serial Bus) controller 512, a memory card interface 514, network controllers 516, 518, 520, an internal bus controller 522, and an indicator 524.

Processor 502 reads various programs stored in secondary storage device 508, develops the programs in main storage device 506 and executes the programs to thereby implement arithmetic operations for standard control as well as various processes. Data is exchanged between processor 502 and each component through chipset 504, and accordingly specific processes of the whole PLC 50 are implemented.

Secondary storage device 508 stores, in addition to a system program, a control program that operates in an execution environment provided by the system program. Communication controller 510 exchanges a control signal and/or data for example with control device 60. USB controller 512 allows data to be exchanged with any information processing device through USB connection.

Memory card interface 514 is configured to allow a memory card 115 to be attached/detached, and enables data such as control program and various settings to be written on memory card 115, or enables data such as control program and various settings to be read from memory card 115.

Network controllers 516, 518, 520 each allow data to be exchanged with any device through a network. For network controllers 516, 518, 520, an industrial network protocol may be adopted. Specifically, network controller 516 to which applicator 30 is connected outputs a signal for driving applicator 30. Network controller 518 to which robot arm 40 is connected outputs a signal for driving robot arm 40. Network controller 520 to which belt conveyor 70 is connected outputs a signal for controlling belt conveyor 70.

Internal bus controller 522 allows data to be exchanged with another unit. For the internal bus, a communication protocol specific to a manufacturer may be used, or a communication protocol identical to or conforming to any industrial network protocol may be used.

Indicator 524 gives notification of the operational state of PLC 50, for example, and is configured as a single or a plurality of LED mounted on the surface of the unit.

Belt conveyor 70 is a transport device for transporting uppers 11 such as products P1 to P3, for example. Belt conveyor 70 transports product P1 from a position where upper 11 can be imaged by camera 20b to a position where an adhesive can be applied to the to-be-bonded surface of upper 11. On belt conveyor 70, a plurality of products P1 to P3 are mounted side by side, and products P1 to P3 are transported successively from the position where upper 11 can be imaged by camera 20b. In connection with the present embodiment, while an example where products P1 to P3 are transported by means of belt conveyor 70 is described, any of other transport means may be used as long as the transport means is capable of transporting products P1 to P3 from the position where upper 11 can be imaged with camera 20b, and to the position where an adhesive can be applied to the to-be-bonded surface of upper 11.

Next, an operation of shoe manufacturing system 100 according to Embodiment 1 is described. Shoe manufacturing system 100 uses respective components shown in FIG. 1 to identify a boundary of to-be-bonded surface 11a for defining an area of to-be-bonded surface 11a to be processed, based on a scribe line drawn on upper 11 that is to serve as a master model. FIG. 4 illustrates a scribe line and a movement path drawn on upper 11. FIG. 4 (*a*) shows a scribe line 1 drawn on upper 11 that is to serve as a master model M. On upper 11 that is to serve as a master model, scribe line 1 indicating the boundary of to-be-bonded surface 11a is drawn by an operator in advance. Scribe line 1 is drawn with a paint that can be identified by camera 20a, and may either be visible or invisible to the operator.

When control device 60 is to identify the boundary of to-be-bonded surface 11a based on three-dimensional shape data of upper 11 of master model M acquired by camera 20a, control device 60 may specify characteristic points (front end 2 and rear end 3, for example) of upper 11 as shown in FIG. 4 (*a*) so as to facilitate identification of the boundary of to-be-bonded surface 11a based on scribe line 1. It would be obvious that control device 60 may identify the boundary of to-be-bonded surface 11a based on scribe line 1 based on three-dimensional shape data of upper 11 of master model M, without identifying characteristic points such as front end 2 and rear end 3.

Further, control device 60 defines a movement path along which applicator 30 moves for applying an adhesive, within the area of to-be-bonded surface 11a enclosed by the identified boundary. FIG. 4 (*b*) shows movement paths 5, 6 that are defined within the area of to-be-bonded surface 11a enclosed by the identified boundary. Movement path 5 is a path for moving applicator 30 along the boundary, and movement path 6 is a path for moving applicator 30 in a zigzag pattern so as to uniformly apply an adhesive within the area of to-be-bonded surface 11a.

When control device 60 identifies the boundary of upper 11 of master model M based on three-dimensional shape data acquired by camera 20a, control device 60 stores information about the identified boundary in boundary database 6106. FIG. 5 illustrates contents of the information stored in boundary database 6106. In the example shown in FIG. 5, the information about the boundary and the information about the movement path that are associated with the information about shoe type (model), part type, shoe size, shoe width, and distinction between right shoe and left shoe are stored in boundary database 6106. For example, when three-dimensional shape data acquired by camera 20a is data of master model M of shoe type "SH1," control device 60 stores information about the part type "upper," the shoe size "25.0 cm," the shoe width "EE" and "right" as distinction between right and left, together with the information about the shoe type "SH1," and stores information about the identified boundary "AAA" and information about the defined movement path "aaa" associated with the above-described information.

In this way, the information about the boundary and the information about the movement path are stored in boundary database 6106, so that the operation of identifying the boundary of upper 11 of a product based on master model M is not required for the same shoe type. Moreover, in addition to the information about the shoe type, the information about the shoe size, shoe width, and distinction between right and left is also stored in boundary database 6106, so that the information stored in boundary database 6106 can be used for identifying the boundary of upper 11 of a different shoe size and a different shoe width. Specifically, when control device 60 is to identify the boundary of upper 11 of a different shoe size and a different shoe width, control device 60 performs a similarity transformation on the information about the boundary of the same shoe type. When control device 60 is to identify the boundary of upper 11 of the right or left shoe different from that of the master model, control device 60 performs a symmetry transformation on the information about the boundary of the same shoe type. When control device 60 is to identify the boundary of upper 11 of a different shoe width, control device 60 performs a multiplication by a correction coefficient for the width direction, or an addition of a predetermined correction value, for example. While it is unnecessary to store, in boundary database 6106, the information about the boundary and the information about the movement path of the same shoe types, the information about the boundary and the information about the movement path of the same shoe types with different shoe sizes and different shoe widths may be stored in boundary database 6106.

Figure 6:
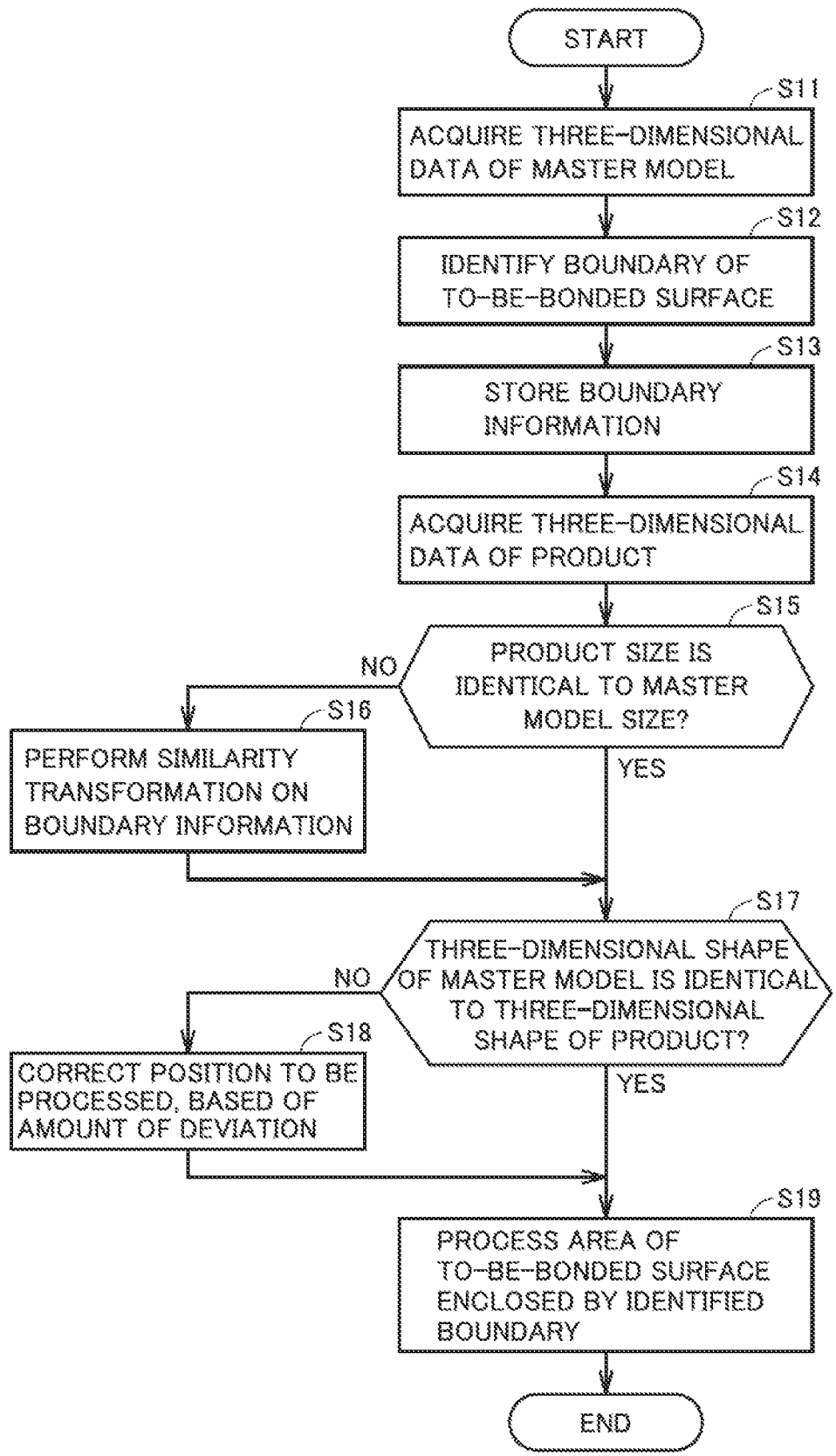
FIG. 6 is a flowchart for illustrating a process of the shoe manufacturing system according to Embodiment 1.

Shoe manufacturing system 100 uses the identified boundary of master model M to process (apply an adhesive to) to-be-bonded surface 11a of upper 11 of a product which is not master model M, without drawing the scribe line on upper 11. In the following, a specific process of shoe manufacturing system 100 is described by means of a flowchart. FIG. 6 is a flowchart for illustrating a process of shoe manufacturing system 100 according to Embodiment 1. Initially, control device 60 acquires three-dimensional shape data of upper 11 of master model M with camera 20a (step S11). As described above with reference to FIG. 4 (*a*), control device 60 identifies the boundary of the to-be-bonded surface, based on scribe line 1 drawn on upper 11 of master model M (step S12). For each shoe type, control device 60 stores the information about the identified boundary in boundary database 6106 (step S13). When control device 60 defines a movement path as shown in FIG. 4 (*b*) based on the identified boundary, control device 60 also stores the information about the defined movement path in boundary database 6016 for each shoe type.

Next, control device 60 acquires, with camera 20b, three-dimensional shape data of upper 11 of a product such as products P1, P2, P3 other than master model M (step S14). Control device 60 determines whether or not the shoe size of the product is identical to the shoe size of master model M or not (step S15). When the shoe size of the product is not identical to the shoe size of master model M (NO in step S15), control device 60 performs a similarity transformation on the information about the boundary stored in boundary database 6106 (step S16). Specifically, when product P1 of the shoe type "SH1" has a shoe size of "27.0 cm" and the same shoe type "SH1" stored in boundary database 6106 has the shoe size "25.0 cm," control device 60 performs a similarity transformation on the stored information about the boundary so as to extend the boundary to the boundary of the shoe size "27.0 cm." When the information about the movement path is also stored in boundary database 6106, control device 60 also performs a similarity transformation on the information about the movement path so as to extend the movement path to the movement path for the shoe size "27.0 cm." When control device 60 identifies the boundary of upper 11 of the right or left shoe different from that of the master model, control device 60 performs a symmetry transformation on the information about the boundary of the same shoe type. When control device 60 identifies the boundary of upper 11 of a shoe width different from the master model, control device 60 performs a multiplication, for example, by a correction coefficient for the width direction.

After step S16 or when the shoe size of the product is identical to the shoe size of master model M (YES in step S15), control device 60 determines whether or not the three-dimensional shape of upper 11 of master model M is identical to the three-dimensional shape of upper 11 of the product (step S17). When the three-dimensional shape of upper 11 of master model M is not identical to the three-dimensional shape of upper 11 of the product (NO in step S17), control device 60 corrects the position to which an adhesive is to be applied by applicator 30 (the position to be processed), based on the amount of deviation of the three-dimensional shape of upper 11 of the product, from the three-dimensional shape of upper 11 of master model M (step S18). Specifically, control device 60 defines the movement path as the position to which an adhesive is to be applied by applicator 30 on upper 11 of master model M, and therefore, if the position of upper 11 of product P1 for example is deviated from the position of upper 11 of master model M, applicator 30 cannot apply an adhesive to the correct position. In view of this, control device 60 determines whether or not the three-dimensional shape of upper 11 of master model M is identical to the three-dimensional shape of upper 11 of product P1 and, when they are different from each other, control device 60 determines the amount of deviation of the position of product P1 from the position of master model M and corrects the movement path by the amount of deviation. In this way, control device 60 enables applicator 30 to apply an adhesive to the correct position on product P1 at the position deviated from the position of master model M.

After step S18 or when the three-dimensional shape of upper 11 of master model M is identical to the three-dimensional shape of upper 11 of the product (YES in step S17), control device 60 causes applicator 30 to apply an adhesive in the area of the to-be-bonded surface enclosed by the identified boundary (step S19).

As seen from the above, shoe manufacturing system 100 according to Embodiment 1 processes to-be-bonded surface 11a of upper 11 (first shoe part) before bonding the sole (second shoe part) to upper 11. Shoe manufacturing system 100 includes: holding platform 10 (holder) that holds upper 11; cameras 20a, 20b (imager) that acquire three-dimensional shape data of upper 11 held by holding platform 10; applicator 30 (processing unit) that applies an adhesive to to-be-bonded surface 11a; robot arm 40 (moving mechanism) that moves applicator 30; and control device 60 (controller) that controls robot arm 40 based on the three-dimensional shape data acquired by cameras 20a, 20b, and controls applicator 30 that applies an adhesive to to-be-bonded surface 11a. Control device 60 identifies a boundary of to-be-bonded surface 11a of upper 11 that is to serve as a master model M among a plurality of uppers 11, for defining an area of to-be-bonded surface 11a to be processed, based on the three-dimensional shape data of master model M acquired by camera 20a. Control device 60 controls robot arm 40 for each of uppers 11 (such as products P1 to P3) other than master model M, to cause applicator 30 to apply an adhesive to the area of to-be-bonded surface 11a enclosed by the identified boundary.

Thus, shoe manufacturing system 100 according to Embodiment 1 identifies the boundary of to-be-bonded surface 11a for defining an area of to-be-bonded surface 11a to be processed, based on the three-dimensional shape data of master model M, and then processes each of uppers 11, to thereby enable reduction of the labor required for identifying the boundary of each of uppers 11.

A method of controlling shoe manufacturing system 100 according to Embodiment 1 includes:
identifying a boundary of to-be-bonded surface 11a of upper 11 that is to serve as master model M among a plurality of uppers 11, for defining an area of to-be-bonded surface 11a to be processed, based on the three-dimensional shape data of master model M acquired by camera 20a (step S12); and
controlling robot arm 40 for each of uppers 11 other than master model M, to cause applicator 30 to apply an adhesive to the area of to-be-bonded surface 11a enclosed by the identified boundary (step S19).

For upper 11 of the same model as master model M and a different size from master model M, control device 60 may perform a similarity transformation on the identified boundary, and control robot arm 40 to cause applicator 30 to apply an adhesive to the area of to-be-bonded surface 11a enclosed by the identified boundary. In this way, shoe manufacturing system 100 enables reduction of the labor required for identifying respective boundaries of products that are of the same shoe type as the master model and of different sizes from the master model.

Camera 20b may acquire the three-dimensional shape data of each of uppers 11 (such as products P1 to P3) other than master model M. Based on a comparison between the three-dimensional shape data of master model M and the three-dimensional shape data of each upper 11, control device 60 may correct the position where an adhesive is to be applied to to-be-bonded surface 11a. Specifically, based on the amount of deviation of the three-dimensional shape data of upper 11 acquired by camera 20b, from the three-dimensional shape data of the master model within the area of to-be-bonded surface 11a enclosed by the boundary, control device 60 may correct the position (movement path) of applicator 30 to be moved by robot arm 40 (step S18). Thus, even when the position of upper 11 such as products P1 to P3 transported by belt conveyor 70 is not identical to the position of master model M, shoe manufacturing system 100 can apply an adhesive appropriately to to-be-bonded surface 11a. Rather than correcting the position (movement path) of applicator 30 to be moved by robot arm 40, control device 60 may correct the position of upper 11 itself such as products P1 to P3 mounted on belt conveyor 70, based on the amount of deviation.

Control device 60 may define the movement path of applicator 30 within the area of to-be-bonded surface 11a enclosed by the identified boundary and control robot arm 40 so as to move applicator 30 along the movement path. Thus, shoe manufacturing system 100 can precisely process the area of to-be-bonded surface 11a.

Control device 60 may identify scribe line 1 drawn on master model M as the boundary, based on the three-dimensional shape data of master model M acquired by camera 20a. As shown in FIG. 4 (a), control device 60 identifies the boundary based on scribe line 1 drawn on master model M. Thus, shoe manufacturing system 100 can reliably identify the boundary based on master model M.

Shoe manufacturing system 100 may further include boundary database 6106 that stores information about the identified boundary for each master model M. Thus, the information about the boundary of the same shoe type may be reused.

Modification 1

According to the above description of the embodiment, the operator is required to draw scribe line 1 on master model M in advance. Shoe manufacturing system 100, however, may not necessarily require the operator to draw scribe line 1 on master model M in advance. In the following, a modification is described in which the boundary of to-be-bonded surface 11a is identified without drawing scribe line 1 on master model M. FIG. 7 illustrates a modification of the method of identifying the boundary based on the three-dimensional shape data of master model M. In FIG. 7 (a), camera 20a acquires the three-dimensional shape data of master model M having upper 11 and sole 12 that are bonded together. Based on the three-dimensional shape data of master model M acquired by camera 20a, control device 60 identifies the border between upper 11 and sole 12 that are bonded together, as the boundary of to-be-bonded surface 11a. Thus, the operator is not required to draw scribe line 1 on master model M in advance.

In FIG. 7 (h), camera 20a separately acquires the three-dimensional shape data of upper 11 of master model M and the three-dimensional shape data of sole 12 of master model M, rather than the three-dimensional shape data of master model M having upper 11 and sole 12 that are bonded together. Based on the three-dimensional shape data of upper 11 and the three-dimensional shape data of sole 12, control device 60 predicts the border between upper 11 and sole 12 that are bonded together, to identify the predicted border as the boundary of to-be-bonded surface 11a. Thus, the operator is not required to draw scribe line 1 on master model M in advance, and not required to prepare master model M having upper 11 and sole 12 that are bonded together.

Further, the three-dimensional shape data of upper 11 of master model M may be acquired by camera 20a and, on the three-dimensional shape data of upper 11, two imaginary points (front end 2 and rear end 3 for example) as characteristic points as well as imaginary scribe line 1 may be drawn by software to identify the boundary of to-be-bonded surface 11a.

Modification 2

Figure 8:
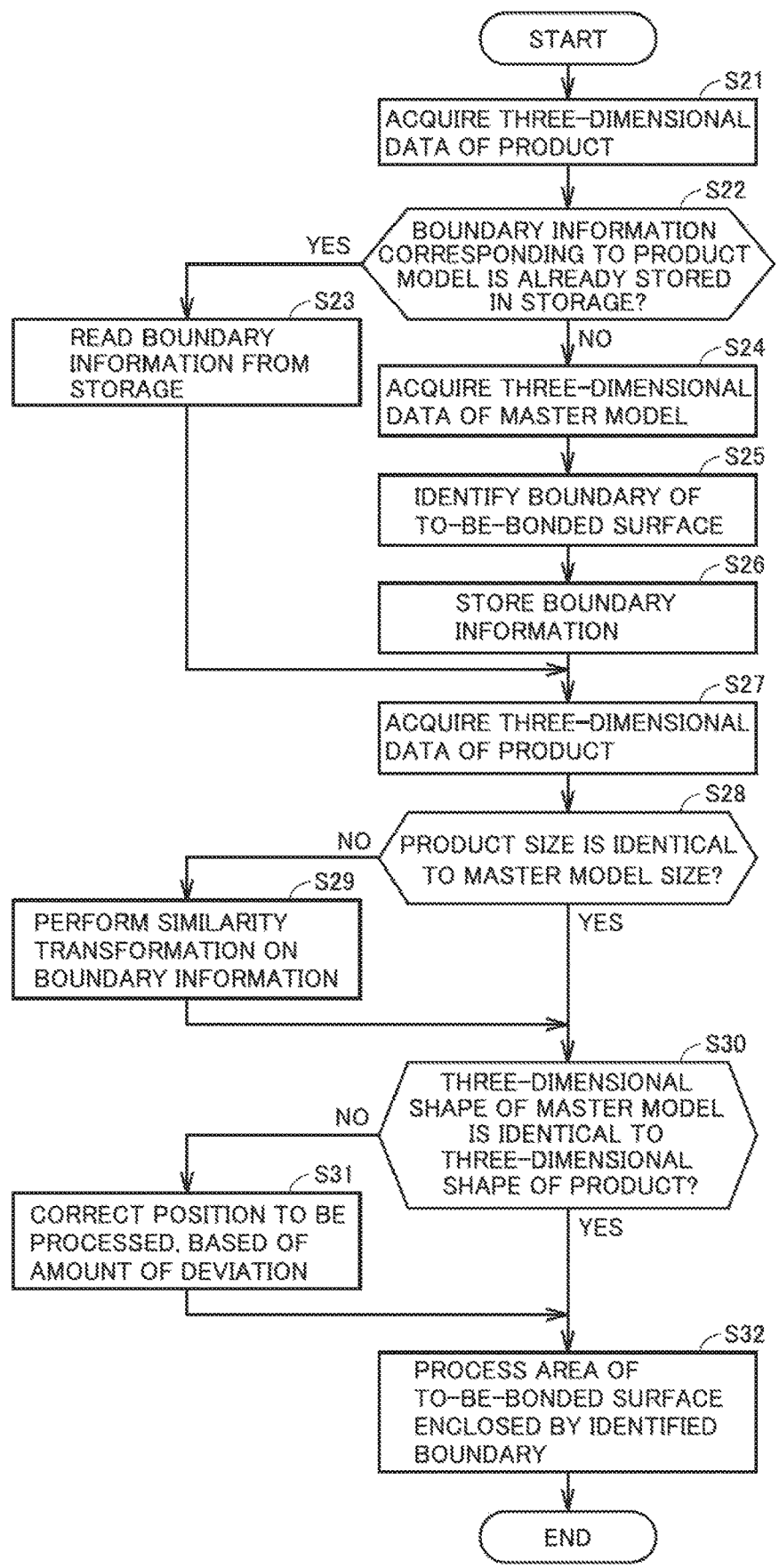
FIG. 8 is a flowchart for illustrating a modification of the process of the shoe manufacturing system according to Embodiment 1.

According to the above description of the embodiment, the shoe type of master model M is identical to the shoe type of products P1 to P3 to be manufactured, in the process of shoe manufacturing system 100. Shoe manufacturing system 100, however, may also be applied to manufacture of products of various different shoe types. In the following, a modification of the process of shoe manufacturing system 100 is described that is applied to manufacture of products of various different shoe types. FIG. 8 is a flowchart for illustrating the modification of the process of shoe manufacturing system 100 according to Embodiment 1.

Initially, control device 60 acquires three-dimensional shape data of upper 11 of product P1 by means of camera 20b (step S21). Control device 60 determines whether or not information about the boundary corresponding to the shoe type (model) of product P1 is already stored in boundary database 6106 (storage) (step S22). When the information about the boundary is already stored in boundary database 6106 (YES in step S22), control device 60 reads the information about the boundary of the corresponding shoe type from boundary database 6106 (step S23). Specifically, when the shoe type of product P1 is "SH1," control device 60 reads, from boundary database 6106 shown in FIG. 5, the boundary information "AAA" and the movement path information "aaa" associated with "SH1."

When the boundary information is not stored in boundary database 6106 (NO in step S22), control device 60 acquires the three-dimensional shape data of upper 11 of master model M corresponding to the shoe type of product P1, by means of camera 20a (step S24). Based on scribe line 1 drawn on upper 11 of master model M acquired in step S24, control device 60 identifies the boundary of the to-be-bonded surface (step S25). Control device 60 stores, in boundary database 6106, the information about the boundary which is newly identified based on master model M of the shoe type (step S26).

Next, control device 60 acquires the three-dimensional shape data of upper 11 of a product such as products P1, P2, P3 other than master model M, by means of camera 20b (step S27). Because the three-dimensional shape data of upper 11 of product P1 has already been acquired in step S21, this step may be skipped for product P1.

Control device 60 determines whether or not the shoe size of the product is identical to the shoe size of master model M (step S28). When the shoe size of the product is not identical to the shoe size of master model M (NO in step S28), control device 60 performs a similarity transformation on the boundary information stored in boundary database 6106 (step S29).

After step S29 or when the shoe size of the product is identical to the shoe size of master model M (YES in step S28), control device 60 determines whether or not the three-dimensional shape of upper 11 of master model M is identical to the three-dimensional shape of upper 11 of the product (step S30). When the three-dimensional shape of upper 11 of master model M is not identical to the three-dimensional shape of upper 11 of the product (NO in step S30), control device 60 corrects the position to which an adhesive is to be applied by applicator 30 (the position to be processed), based on the amount of deviation of the three-dimensional shape of upper 11 of the product from the three-dimensional shape of upper 11 of master model M (step S31).

After step S31 or when the three-dimensional shape of upper 11 of master model M is identical to the three-dimensional shape of upper 11 of the product (YES in step S30), control device 60 applies an adhesive to the area of the to-be-bonded surface enclosed by the identified boundary, by means of applicator 30 (step S32).

In Modification 2 as described above, when the shoe type (model) of upper 11 is different from master model M and the information about the boundary of a corresponding shoe type (model) is stored in boundary database 6106 (storage), control device 60 controls robot arm 40 so as to enable applicator 30 to process the area of to-be-bonded surface 11a of upper 11 enclosed by the stored boundary. In contrast, when the information about the boundary of a corresponding shoe type (model) is not stored in boundary database 6106 (storage), control device 60 acquires the three-dimensional shape data of a corresponding new master model M by means of camera 20a, and identifies the boundary of to-be-bonded surface 11a for defining the area of to-be-bonded surface 11a to be processed, based on the acquired three-dimensional shape data. Thus, for a shoe type with its boundary already identified, shoe manufacturing system 100 according to Modification 2 can use the information about the boundary stored in boundary database 6106, which enables reduction of the operation of identifying the boundary.

Modification 3

Figure 9:
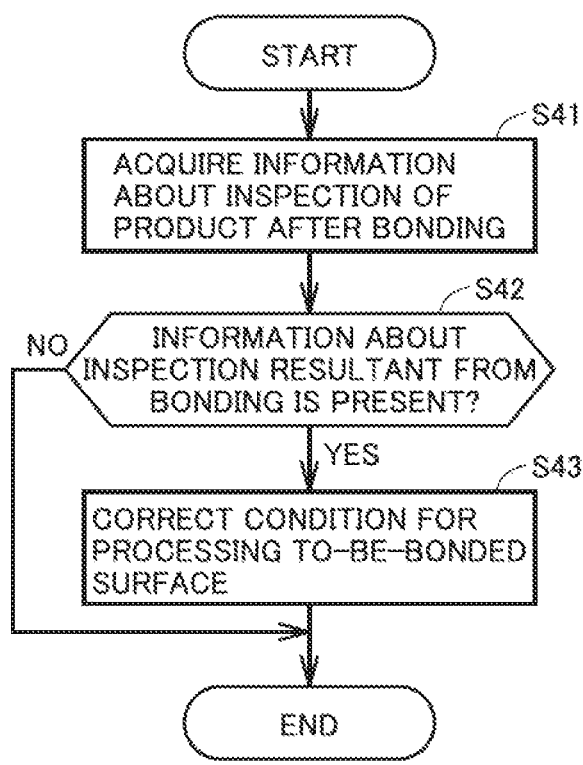
FIG. 9 is a flowchart for illustrating a process of feedback control for correcting conditions for processing by the shoe manufacturing system according to Embodiment 1.

Shoe manufacturing system 100 may further adopt feedback control for correcting conditions for processing, such as the movement path of applicator 30 that applies an adhesive, based on the result of an inspection of a product having upper 11 and sole 12 already bonded together. FIG. 9 is a flowchart for illustrating a process of feedback control for correcting conditions for processing by shoe manufacturing system 100 according to Embodiment 1.

Initially, control device 60 acquires information about an inspection of a product having upper 11 and sole 12 already bonded together (step S41). Specifically, an inspection device, which is not shown in FIG. 1, for inspecting a product having upper 11 and sole 12 already bonded together is connected to control device 60 or PLC 50. Control device 60 acquires, from the inspection device, the result of the inspection of the product, as inspection information.

Control device 60 determines whether or not the inspection information acquired from the inspection device includes inspection information resultant from bonding (step S42). Specifically, the inspection device images, with a camera, the product having upper 11 and sole 12 already bonded together. When the amount of overflow of an adhesive from the border between upper 11 and sole 12 is inspected, control device 60 may determine that the inspection information resultant from bonding is included in the inspection information acquired from the inspection device.

When control device 60 determines that the inspection information resultant from bonding is included (YES in step S42), control device 60 corrects condition(s) for processing the to-be-bonded surface, based on the inspection information resultant from bonding (step S43). Specifically, based on the amount of overflow of an adhesive, which is inspection information acquired from the inspection device, control device 60 corrects the movement path of applicator 30 that applies an adhesive. When it is determined that inspection information resultant from bonding is not included (NO in step S42), control device 60 ends the process.

Thus, control device 60 according to Modification 3 can correct condition(s) for processing to-be-bonded surface 11a, based on the inspection information obtained after sole 12 is bonded to upper 11, to enable improvements of the conditions for processing.

Embodiment 2

The above-described shoe manufacturing system 100 according to Embodiment 1 acquires the three-dimensional shape data of master model M by means of camera 20a to identify the boundary of to-be-bonded surface 11a of the upper. In connection with Embodiment 2, a shoe manufacturing system is described that can identify the boundary of to-be-bonded surface 11a of the upper without preparing master model M.

Figure 10:
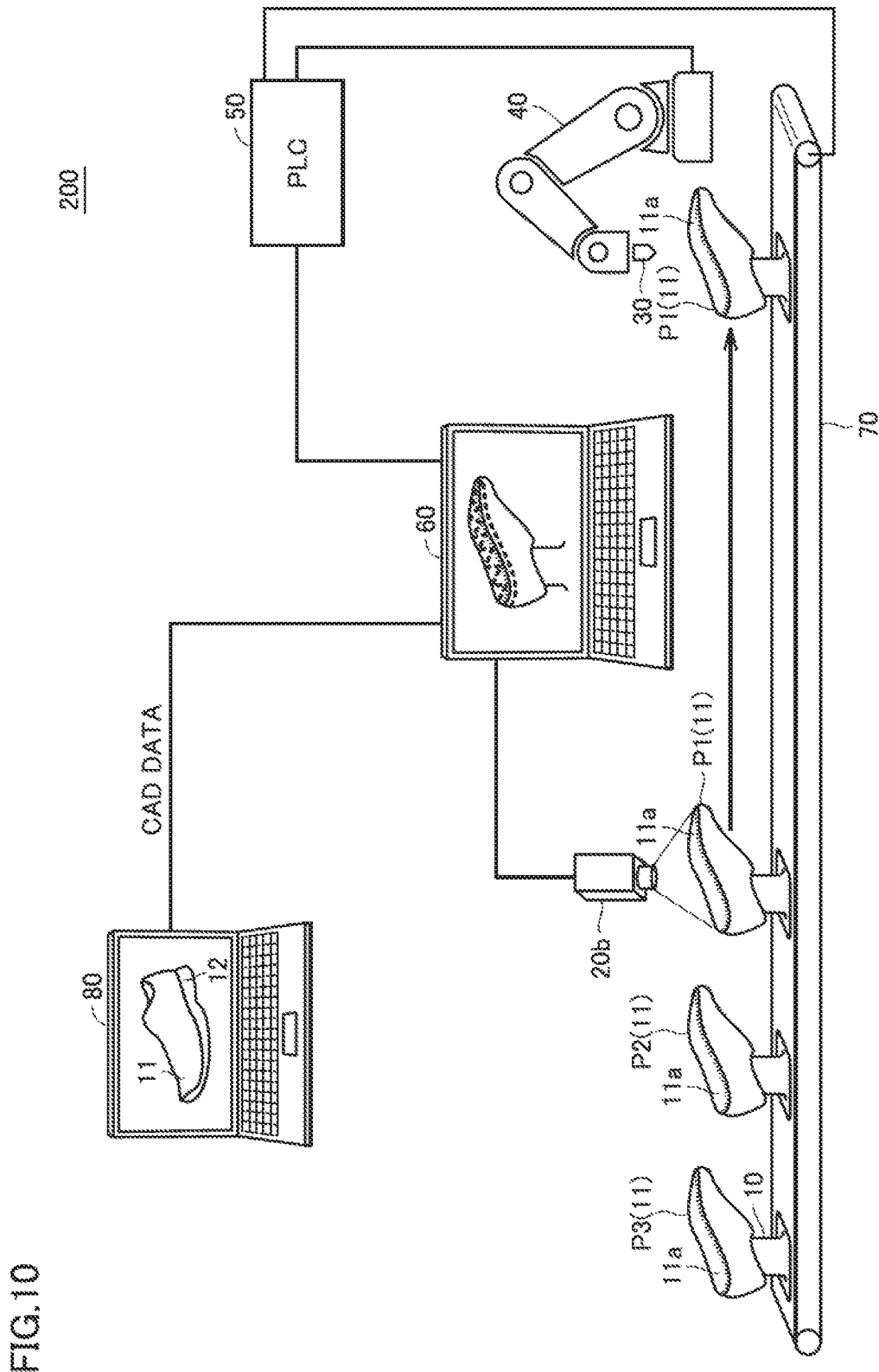
FIG. 10 is a schematic diagram showing an example configuration of a shoe manufacturing system according to Embodiment 2.

FIG. 10 is a schematic diagram showing an example configuration of a shoe manufacturing system 200 according to Embodiment 2. Referring to FIG. 10, shoe manufacturing system 200 includes a holding platform 10, a camera 20b, an applicator 30, a robot arm 40, and a control device 60. Further, shoe manufacturing system 200 includes a PLC 50, a belt conveyor 70, and a CAD device 80. In shoe manufacturing system 200 shown in FIG. 10, the same component as shoe manufacturing system 100 shown in FIG. 1 is denoted by the same reference character, and the detailed description thereof is not repeated.

Shoe manufacturing system 200 identifies the boundary of to-be-bonded surface 11a of the upper of a product, based on CAD data (three-dimensional CAD data) of the product from CAD device 80, instead of acquiring the three-dimensional shape data of master model M by means of camera 20a. CAD device 80 is connected to control device 60 and capable of transmitting, to control device 60, the CAD data of the product having upper 11 and sole 12 bonded together. CAD device 80 is not required to be connected communicably to control device 60, but may at least be able to provide the CAD data to control device 60. For example, CAD device 80 stores CAD data in a USB memory and connects the USB memory to USB controller 620 of control device 60 to thereby provide the CAD data to control device 60.

Based on the CAD data of the product having upper 11 and sole 12 bonded together, control device 60 identifies the border between upper 11 and sole 12 that are bonded together, as the boundary of to-be-bonded surface 11a. The CAD data is not limited to the CAD data of the product having upper 11 and sole 12 bonded together, but may be separate pieces of CAD data, i.e., CAD data of upper 11 and CAD data of sole 12. Based on the CAD data of upper 11 and the CAD data of sole 12, control device 60 predicts the border between upper 11 and sole 12 that are bonded together, to identify the predicted border as the boundary of to-be-bonded surface 11a.

Figure 11:
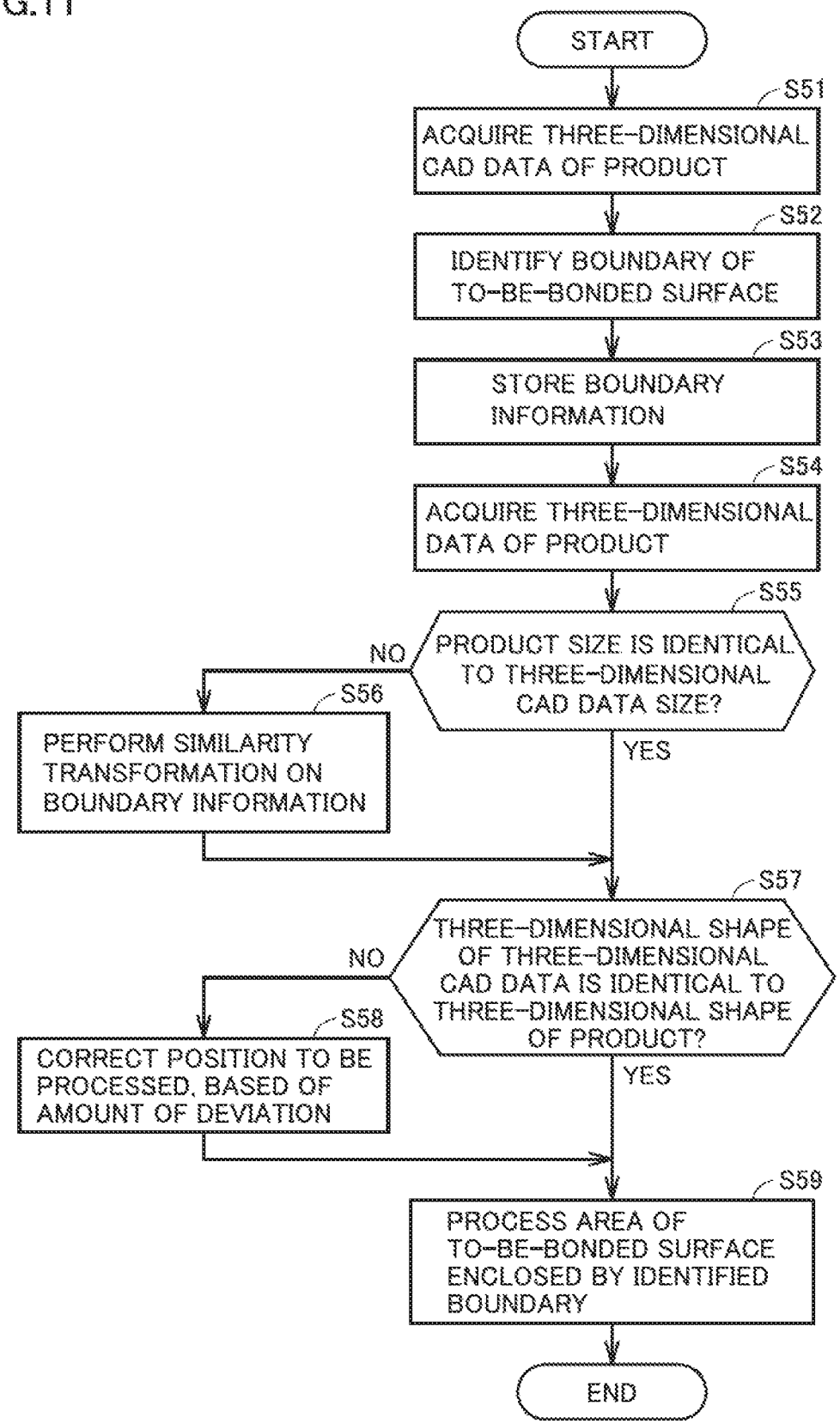
FIG. 11 is a flowchart for illustrating a process of the shoe manufacturing system according to Embodiment 2.

Shoe manufacturing system 200 uses the boundary that is identified based on the CAD data of the product, to process (apply an adhesive to) to-be-bonded surface 11a, without preparing master model M. In the following, a specific process of shoe manufacturing system 200 is described by means of a flowchart. FIG. 11 is a flowchart for illustrating a process of shoe manufacturing system 200 according to Embodiment 2. Initially, control device 60 acquires, from CAD device 80, three-dimensional CAD data of a product (step S51). Based on the CAD data of the product having upper 11 and sole 12 bonded together, control device 60 identifies the boundary of the to-be-bonded surface (step S52). For each shoe type, control device 60 stores information about the identified boundary in boundary database 6106 (step S53).

Next, control device 60 acquires three-dimensional shape data of upper 11 of a product such as products P1, P2, P3, by means of camera 20b (step S54). Control device 60 determines whether or not the shoe size of the product is identical to the shoe size of the three-dimensional CAD data (step S55). When the shoe size of the product is not identical to the shoe size of the three-dimensional CAD data (NO in step S55), control device 60 performs a similarity transformation on the information about the boundary stored in boundary database 6106 (step S56).

After step S56 or when the shoe size of the product is identical to the shoe size of the three-dimensional CAD data (YES in step S55), control device 60 determines whether or not the three-dimensional shape of upper 11 of the three-dimensional CAD data is identical to the three-dimensional shape of upper 11 of the product (step S57). When the three-dimensional shape of upper 11 of the three-dimensional CAD data is not identical to the three-dimensional shape of upper 11 of the product (NO in step S57), control device 60 corrects, based on the amount of deviation of the three-dimensional shape of upper 11 of the product, from the three-dimensional shape of upper 11 of the three-dimensional CAD data, the position to which an adhesive is to be applied by applicator 30 (the position to be processed) (step S58).

After step S58 or when the three-dimensional shape of upper 11 of the three-dimensional CAD data is identical to the three-dimensional shape of upper 11 of the product (YES in step S57), control device 60 applies an adhesive, by means of applicator 30, to the area of the to-be-bonded surface enclosed by the identified boundary (step S59).

As seen from the above, shoe manufacturing system 200 according to Embodiment 2 processes to-be-bonded surface 11a of upper 11 (first shoe part) before bonding sole 12 (second shoe part) to upper 11. Shoe manufacturing system 200 includes: holding platform 10 (holder) that holds upper 11; camera 20b (imager) that acquires three-dimensional shape data of upper 11 held by holding platform 10; applicator 30 (processing unit) that applies an adhesive to to-be-bonded surface 11a; robot arm 40 (moving mechanism) that moves applicator 30; and control device 60 (controller) that controls robot arm 40 based on the three-dimensional shape data acquired by camera 20b, and controls applicator 30 that applies an adhesive to to-be-bonded surface 11a. Based on three-dimensional CAD data of upper 11 to which sole 12 is already bonded that is prepared in advance, control device 60 identifies a boundary of to-be-bonded surface 11a, for defining an area of to-be-bonded surface 11a to be processed. Control device 60 controls robot arm 40 for each of uppers 11 to cause applicator 30 to apply an adhesive to the area of to-be-bonded surface 11a enclosed by the identified boundary.

Thus, shoe manufacturing system 200 according to Embodiment 2 identifies the boundary of to-be-bonded surface 11a for defining an area of to-be-bonded surface 11a to be processed, based on the three-dimensional CAD data, and then processes each of uppers 11, to thereby enable reduction of the labor required for identifying the boundary of each of uppers 11.

A method of controlling shoe manufacturing system 200 according to Embodiment 2 includes:

identifying a boundary of to-be-bonded surface 11a for defining an area of to-be-bonded surface 11a to be processed, based on three-dimensional CAD data of upper 11 to which sole 12 is already bonded that is prepared in advance (step S52), and controlling robot arm 40 for each of uppers 11 to cause applicator 30 to apply an adhesive to the area of to-be-bonded surface 11a enclosed by the identified boundary (step S59).

Shoe manufacturing system 200 according to Embodiment 2 may also be combined with any characteristics of Modifications 2 and 3 described above in connection with Embodiment 1.

Other Modifications (1) According to the above-described embodiment, control device 60 defines a movement path for moving applicator 30 (processing unit) in the area of to-be-bonded surface 11a enclosed by the boundary. The embodiment, however, is not limited to this, and control device 60 may not define the movement path. For example, control device 60 may only specify, in robot arm 40, the area of to-be-bonded surface 11a enclosed by the boundary, so as to cause robot arm 40 to move applicator 30 (processing unit) in a predetermined pattern within the area. Alternatively, robot arm 40 may define the movement path based on the information about the area of to-be-bonded surface 11a enclosed by the boundary.

(2) According to the above-described embodiment, control device 60 includes boundary database 6106. The embodiment, however, is not limited to this, and boundary database 6106 may not be provided in control device 60 and a boundary database may be provided on a cloud. If it is only one type of shoes that are to be manufactured by the shoe manufacturing system, control device 60 may not have boundary database 6106 but may only store, in a memory, information about the identified boundary.

(3) According to the above-described embodiment, three-dimensional shape data of upper 11 such as products P1 to P3 is acquired by means of camera 20b. Control device 60 acquires the three-dimensional shape data of upper 11 such as products P1 to P3 to perform control for matching the position of the product such as products P1 to P3 with the position of master model M. If, however, the product such as products P1 to P3 is disposed so that its position matches with the position of master model M, control device 60 is not required to perform control for matching the position of the product such as products P1 to P3 with the position of master model M. The process of acquiring the three-dimensional shape data of upper 11 such as products P1 to P3 by means of camera 20b is therefore unnecessary.

It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST 10 holding platform; 11 upper; 11a to-be-bonded surface; 12 sole; 20a, 20b camera; 30 applicator; 40 robot arm; 60 control device; 70 belt conveyor; 80 CAD device; 100, 200 shoe manufacturing system

The invention claimed is:

1. A shoe manufacturing system for processing a processing area of each of first shoe parts before bonding second shoe parts to the first shoe parts to form shoes of a first model, the shoe manufacturing system comprising:
an imager that acquires three-dimensional shape data of a master shoe part of the first model for processing the first shoe parts, the master shoe part having an area corresponding to the processing area;
a processing unit that processes the processing area of each of the first shoe parts;
a moving mechanism that moves the processing unit; and
a controller configured to:
identify a first boundary of the area of the master shoe part based on the three-dimensional shape data of the master shoe part;
identify a processing area for each of the first shoe parts based on the first boundary; and
control the moving mechanism for the processing unit to perform the processing on the processing area of each of the first shoe parts,
wherein the controller identifies a scribe line drawn on the master shoe part as the first boundary based on the three-dimensional shape data of the master shoe part, and wherein, after a first one of the second shoe parts is bonded to a first one of the first shoe parts, the controller i) obtains inspection information of the first one of the second shoe parts being bonded the first one of the first shoe parts, and ii) adjusts, based on determining that the inspection information indicates that the first one of the second shoe parts is improperly bonded to the first one of the first shoe parts, conditions for processing a processing area of a second one of the first shoe parts where a second one of the second shoe parts is to be bonded to.

2. The shoe manufacturing system according to claim 1, wherein
the first shoe parts of the first model include first-sized first shoe parts each having a first size and second-sized first shoe parts each having a second size different from the first size,
the master shoe part has a same size as the first-sized first shoe parts,
when the first boundary of the master shoe part is applied to second-sized first shoe parts to identify a processing area of the second-sized first shoe parts, the controller performs a similarity transformation on the first boundary to obtain a second boundary, and identifies the processing area of each of the second-sized shoe parts based on the second boundary.

3. The shoe manufacturing system according to claim 2, further comprising a storage that stores information about a boundary for each of models, wherein
when the storage stores a boundary for the first model, the controller uses the stored boundary to identify the processing area for each of the first shoe parts, and
when the storage does not store the boundary of the first model, the controller controls the imager to acquire the three-dimensional shape data of the master shoe part of the first model in order to obtain the first boundary, and identifies the processing area for each of the first shoe parts based on the first boundary.

4. The shoe manufacturing system according to claim 3, wherein
the imager acquires three-dimensional shape data of each of the first shoe parts, and
the controller adjusts the processing area of each of the first shoe parts based on a comparison between the three-dimensional shape data of the master shoe part and the three-dimensional shape data of each of the first shoe parts.

5. The shoe manufacturing system according to claim 4, wherein
the comparison includes obtaining a deviation obtained based on a comparison between a three-dimensional shape of each of the first shoe parts and a three-dimensional shape of the area of the master shoe part, and
the controller adjusts the processing area of each of the first shoe parts based on the deviation.

6. The shoe manufacturing system according to claim 2, wherein
the imager acquires three-dimensional shape data of each of the first shoe parts, and
the controller adjusts the processing area of each of the first shoe parts based on a comparison between the three-dimensional shape data of the master shoe part and the three-dimensional shape data of each of the first shoe parts.

7. The shoe manufacturing system according to claim 6, wherein
the comparison includes obtaining a deviation obtained based on a comparison between a three-dimensional shape of each of the first shoe parts and a three-dimensional shape of the area of the master shoe part, and
the controller adjusts the processing area of each of the first shoe parts based on the deviation.

8. The shoe manufacturing system according to claim 1, further comprising a storage that stores information about a boundary for each of models, wherein
when the storage stores a boundary for the first model, the controller uses the stored boundary to identify the processing area for each of the first shoe parts, and
when the storage does not store the boundary of the first model, the controller controls the imager to acquire the three-dimensional shape data of the master shoe part of the first model in order to obtain the first boundary, and identifies the processing area for each of the first shoe parts based on the first boundary.

9. The shoe manufacturing system according to claim 8, wherein
the imager acquires three-dimensional shape data of each of the first shoe parts, and
the controller adjusts the processing area of each of the first shoe parts based on a comparison between the three-dimensional shape data of the master shoe part and the three-dimensional shape data of each of the first shoe parts.

10. The shoe manufacturing system according to claim 9, wherein
the comparison includes obtaining a deviation obtained based on a comparison between a three-dimensional shape of each of the first shoe parts and a three-dimensional shape of the area of the master shoe part, and
the controller adjusts the processing area of each of the first shoe parts based on the deviation.

11. The shoe manufacturing system according to claim 1, wherein
the imager acquires three-dimensional shape data of each of the first shoe parts, and
the controller adjusts the processing area of each of the first shoe parts based on a comparison between the three-dimensional shape data of the master shoe part and the three-dimensional shape data of each of the first shoe parts.

12. The shoe manufacturing system according to claim 11, wherein
the comparison includes obtaining a deviation obtained based on a comparison between a three-dimensional shape of each of the first shoe parts and a three-dimensional shape of the area of the master shoe part, and
the controller adjusts the processing area of each of the first shoe parts based on the deviation.

13. The shoe manufacturing system according to claim 1, wherein
the master shoe part has another shoe part bonded to the master shoe part, the another shoe part having a shape corresponding to a shape of each of the second shoe parts of the first model, and
the controller identifies, as the first boundary, a border between the master shoe part and the another shoe part.

14. The shoe manufacturing system according to claim 1, wherein the first one of the second shoe parts is bonded to the first one of the first shoe parts using an adhesive, wherein the inspection information includes a visible inspection of a bonded boundary between the at least first one of the second shoe parts and the first one of the first shoe parts, and wherein the controller adjusts application of the adhesive onto the processing area of the second one of the first shoe parts based on determining that the inspection information indicates the adhesive being visible at the bonded boundary.

15. The shoe manufacturing system according to claim 1, further comprising:

a processing unit configured to perform the processing on the processing area of each of the first shoe parts, a moving mechanism configured to move the processing unit, wherein the controller defines a movement path of the processing unit within the processing area, and controls the moving mechanism to cause the processing unit to move along the movement path.

16. A shoe manufacturing system for processing a processing area of each of first shoe parts before bonding second shoe parts to the first shoe parts to form shoes of a first model, the shoe manufacturing system comprising:

an imager that acquires three-dimensional shape data of each of first shoe parts to be used for processing the first shoe parts;

a processing unit that processes the processing area of each of the first shoe parts;

a moving mechanism that moves the processing unit; and a controller configured to:
 identify a first boundary of the area of the first shoe part based on three-dimensional CAD data of the first shoe part to which the second shoe part is already bonded that is prepared in advance,
 identify a processing area for each of the first shoe parts based on the acquired three-dimensional shape data and the first boundary; and
 control the moving mechanism for the processing unit to perform the processing on the processing area of each of the first shoe parts, wherein the controller identifies a scribe line drawn on a master shoe part as the first boundary based on the three-dimensional shape data of the master shoe part, and wherein, after a first one of the second shoe parts is bonded to a first one of the first shoe parts, the controller i) obtains inspection information of the first one of the second shoe parts being bonded the first one of the first shoe parts, and ii) adjusts, based on determining that the inspection information indicates that the first one of the second shoe parts is improperly bonded to the first one of the first shoe parts, conditions for processing a processing area of a second one of the first shoe parts where a second one of the second shoe parts is to be bonded to.

17. A method of controlling a shoe manufacturing system for processing a processing area of each of first shoe parts before bonding second shoe parts to the first shoe parts to form shoes of a first model, wherein the shoe manufacturing system comprises a processing unit that processes the processing area of each of the first shoe parts, and a moving mechanism that moves the processing unit, the method comprising:

acquiring three-dimensional shape data of a master shoe part of the first model for processing the first shoe parts, the master shoe part having an area corresponding to the processing area;

identifying a first boundary of the area of a master shoe part based on three-dimensional shape data of the master shoe part, wherein the master shoe part is prepared only to define the first boundary;

identifying a processing area for each of the first shoe parts based on the first boundary of the master shoe part, wherein a scribe line drawn on the master shoe part is identified as the first boundary based on the three-dimensional shape data of the master shoe part; and controlling the moving mechanism for the processing unit to perform the processing on the processing area of each of the first shoe parts, wherein, after a first one of the second shoe parts is bonded to a first one of the first shoe parts, i) inspection information of the first one of the second shoe parts being bonded the first one of the first shoe parts is obtained, and ii) based on determining that the inspection information indicates that the first one of the second shoe parts is improperly bonded to the first one of the first shoe parts, conditions for processing a processing area of a second one of the first shoe parts where a second one of the second shoe parts is to be bonded to is adjusted.

* * * * *